(12) United States Patent
Jeffery et al.

(10) Patent No.: US 6,841,810 B1
(45) Date of Patent: Jan. 11, 2005

(54) CELL STRUCTURE FOR BIPOLAR INTEGRATED CIRCUITS AND METHOD

(75) Inventors: Philip Alan Jeffery, Tempe, AZ (US); Kevin Joseph Jurek, Gilbert, AZ (US); Michael S. Lay, Gilbert, AZ (US); Timothy E. Seneff, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/637,405

(22) Filed: Aug. 8, 2003

(51) Int. Cl.[7] ............................................. H01L 27/10
(52) U.S. Cl. ..................... 257/205; 257/197; 438/205; 438/309
(58) Field of Search ................................ 257/205, 197, 257/5, 65, 566, 206; 438/128, 129, 309, 235, 312, 205, 313

Primary Examiner—Eddie Lee
Assistant Examiner—Douglas W. Owens
(74) Attorney, Agent, or Firm—Kevin B Jackson

(57) ABSTRACT

In one embodiment, a bipolar cell (31) includes a cell boundary (32) that defines a cell active area (33), a first array of bipolar transistors (41) is formed within the cell active area (33) and configured for a first function. The bipolar transistors (42) within the first array (41) are parallel to each other. The bipolar cell (31) further includes a second array of bipolar transistors (61) formed within the cell active area (33) and configured for a second function that is different than the first function. The bipolar transistors (62) within the second array (61) are parallel to each other and oriented in a different direction than the transistors (42) in the first array (41).

20 Claims, 6 Drawing Sheets

CELL STRUCTURE FOR BIPOLAR INTEGRATED CIRCUITS AND METHOD

BACKGROUND OF THE INVENTION

This invention relates generally to semiconductor integrated circuits, and more specifically to bipolar integrated circuit (IC) cell or array structures and methods.

Integrated circuit technology has made significant progress over the last forty years. Integrated circuits are now manufactured at much lower costs, with lower power consumption, higher speeds, and smaller sizes. The number of devices manufactured on a single chip exceeded the generally accepted definition of very large scale integration (i.e., more than 100,000 devices per chip) in the mid-1970's. By 1986 this number had grown to over 1 million devices per chip, and by 2000 had exceeded 1 billion devices per chip.

The production of a new integrated circuit begins with a design phase, where the desired functions and necessary operating specifications are initially determined. IC designers create devices from the top down by first identifying large functional blocks. Next, sub-blocks are defined, and finally, logic gates necessary to implement the sub-blocks are selected. Each logic gate is designed by appropriately connecting devices that are ultimately slated for fabrication on semiconductor wafers.

Designers then lay out the circuit, which consists of sets of patterns that correspond to device regions or interconnect structures. Such patterns are sequentially transferred to wafers as part of a wafer fabrication process sequence (e.g., using photolithographic techniques).

As part of a chip design process, designers must select a process technology to produce the device structures that make up a circuit. Such process technologies include CMOS, bipolar, or BiCMOS process technologies. Chip designers typically choose a process technology depending upon specific application requirements including cost, packaging constraints, heat dissipation, switching speeds, power consumption, and noise immunity.

Although logic families based on bipolar process technology are among the most mature in the semiconductor industry, bipolar processing technology continues to be refined to meet growing challenges of speed, lower delay-power product, and higher levels of integration. Such refinements challenge bipolar integrated circuit designers as they strive to produce next generation semiconductor chips in a timely and cost effective manner.

During the layout phase, designers often utilize libraries of standard cells, which comprise for example, reconfigurable arrays of transistors and resistors, to create or generate a particular circuit layout. One problem with prior art bipolar cells or reconfigurable arrays is that they often have wasted space, which impacts density, overall chip size and cost. Additionally, typical prior art bipolar cells have complicated and uneven routes for coupling devices together, which can result in interconnect resistance and capacitance problems. In addition, prior art bipolar cells are not optimized for performance and matching over a wide variety of processes.

Accordingly, a need exists for configurable bipolar cells or arrays that are optimized for density, ease of use, ease of routing, maximum performance, versatility and sensitivity to process variation.

DETAILED DESCRIPTION OF THE DRAWINGS

In general, the present invention pertains to bipolar integrated circuit arrays, and more specifically to improved bipolar transistor arrays or cells. The bipolar cell according to the present invention includes a cell boundary that defines a cell active area, a first array of bipolar transistors formed within the cell active area and configured for a first circuit function. The bipolar transistors within the first array are parallel to each other. The bipolar cell further includes a second array of bipolar transistors formed within the cell active area and configured for a second circuit function that is different than the first function. The bipolar transistors within the second array are parallel to each other and oriented in a different direction than the bipolar transistors in the first array. In a preferred embodiment, the transistors in the second array are substantially perpendicular to the transistors in first array. The configuration according to the present invention is suitable for npn or pnp configurations or combinations thereof. The bipolar cell according to the present invention provides for easier interconnect routing, higher device density, and better integrated circuit performance.

Figure 1:
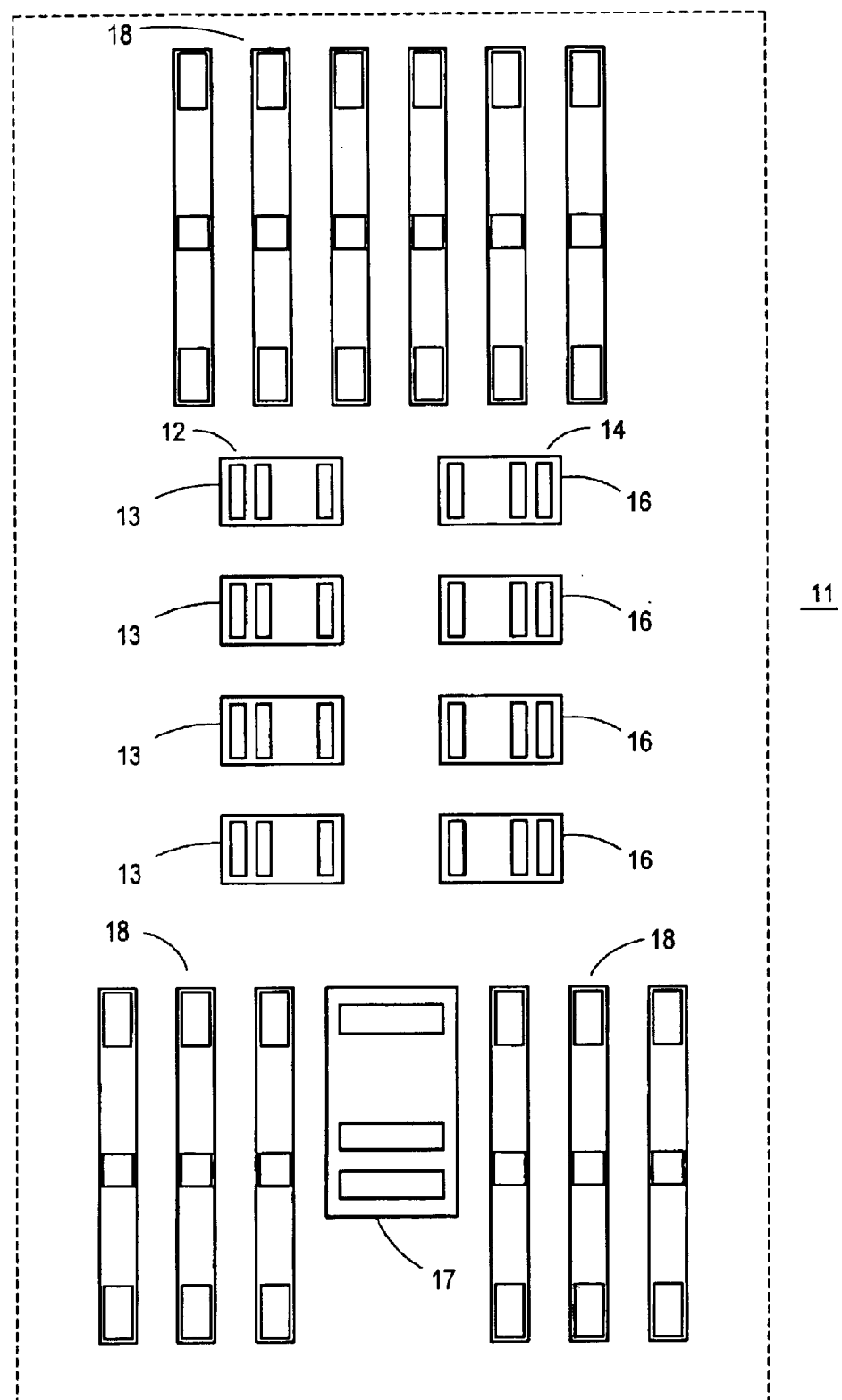
FIG. 1 illustrates, an enlarged top plan view of a prior art bipolar cell.
Figure 2:
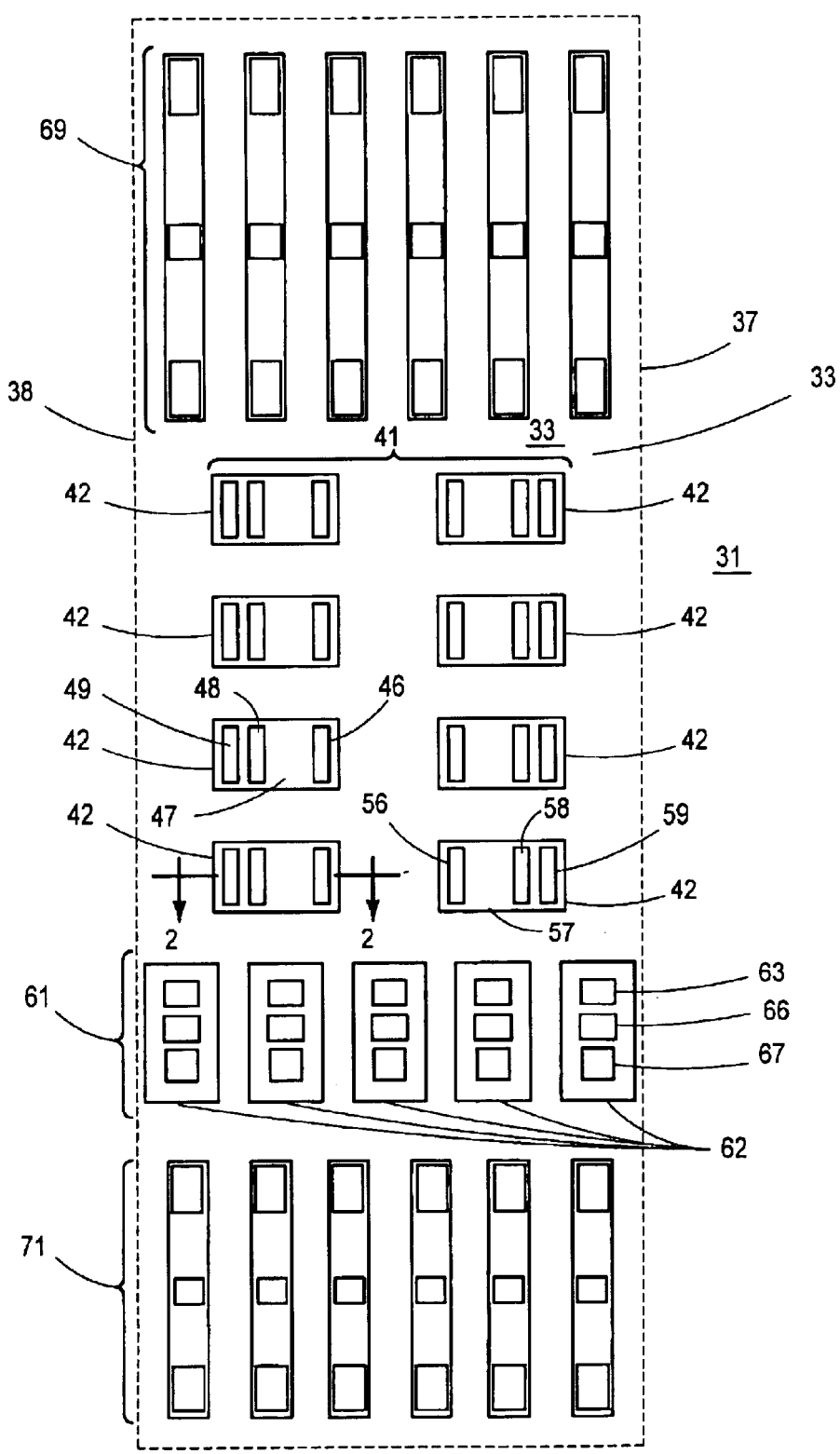
FIG. 2 illustrates an enlarged top plan view of a bipolar cell according to the present invention.

In prior art bipolar cells, devices that perform different circuit functions (e.g., switching transistors and current source transistors) are oriented in the same direction within the cell, placed in the same array, sized the same, and often configured the same (e.g., collector/emitter/base) in order to achieve better electrical matching between devices. FIG. 1 shows an enlarged top plan view of a typical prior art bipolar cell 11, where interconnect layers and vias are not shown for ease of understanding. Bipolar cell 11 includes a first column 12 of transistors 13, a second column 14 of transistors 16, a single transistor 17, and resistor arrays 18. Depending on a specified circuit application, transistors 13, 16 and 17 are selected, for example, to be either switching or current source transistors. Transistors 13 and 16 are oriented the same way regardless of their function in order to provide better electrical matching between devices. Although this prior art approach provides better electrical matching, it does not allow for optimized routing of interconnects or optimized sizing and/or configuration for the different transistor types. In addition, prior art bipolar cells such as that shown in FIG. 1 often are not fully utilized (i.e., some devices are unused), which wastes space. Also, they do not allow for simplified current and voltage scaling, which impacts overall device performance. Additionally, prior art bipolar cells are not as flexible for a given density, and do not provide enough variation for different circuit applications. Turning now to the present invention, FIG. 2 shows an enlarged top view of a bipolar cell, array, structure, or reconfigurable transistor array 31 according to the present invention. Interconnect layers and vias are not shown for ease of understanding. Array 31 includes an active area, repeatable cell area, or device active area 33. Active area 33 defines a region that is repeated when designing and subsequently forming an integrated circuit device.

According to the present invention, cell active area 33 includes a first array of bipolar transistors 41, where each bipolar transistor 42 in first array 41 is parallel to each other as shown in FIG. 2, and configured for an identical function. For example, transistors 42 are designed or configured to provide a switching function. Preferably, for ease of use and flexibility, transistors 42 are the same size and their base/emitter/collector regions are ordered in a similar way.

In a preferred embodiment when transistors 42 are used as switching devices, the transistors in array 41 adjacent to a side 38 of cell 31 comprise a collector 46, space 47, emitter 48, base 49 (i.e., collector/space/emitter/base from right to left) configuration. Likewise, the transistors in array 41 adjacent to a side 37 comprise a collector 56, space, 57, emitter 58, base 59 (i.e., collector/space/emitter/base from left to right) configuration where base regions 49 and 59 are opposite each other in array 41, and collector regions 46 and 56 are adjacent to each other. The term space refers to a first metal routing channel or a portion of a device in which to route an interconnect or metal layer without contacting an active portion of the device.

Cell 31 further includes a second array of bipolar transistors 61 within cell active area 33, where each bipolar transistor 62 in second array 61 is parallel to each other, and oriented differently than transistors 42 in array 41. Preferably, transistors 62 are substantially orthogonal to, substantially perpendicular to, or rotated about 90 degrees with respect to transistors 42 in array 41 as shown in FIG. 2. Additionally, transistors 61 are configured for an identical function that is different than the function of transistors 42. For example, if transistors 42 are configured for a switching function, transistors 62 are configured, for example, as current source devices.

By grouping transistors 42 and 62 according to the present invention, the impact of semiconductor process variation on the different devices is minimized because devices with the same function are grouped together when formed on semiconductor substrate. Additionally, the configuration and orientation of the present invention simplifies routing (e.g., reduces use of multiple meal layers), improves device performance (e.g., reduces routing parasitics), and allows for an increased density of devices.

Cell 31 also includes a first resistor array 69 adjacent to array 41 and a second resistor array 71 adjacent to array 61. Preferably, the resistors in array 69 are parallel to each other, and the resistors in array 71 are parallel to each other. Preferably, the resistors in arrays 69 and 71 have a size and ratio that provides multiple choices for current and signal voltage swings.

In a preferred embodiment, when transistors 62 are used as current source devices, transistors 62 comprise a collector 63, base 66, emitter 67 (i.e., collector/base/emitter) configuration as shown in FIG. 2. This configuration allows for easier routing from emitters 48 of transistors 42 to collectors 63 of transistors 62, and from emitters 67 of transistors 62 to resistors in resistor array 71.

Arrays 41 and 61 preferably comprise at least two transistors 42 and 62 respectively. Preferably, array 41 comprises a 2×M array, and array 61 comprises a 1×N array to provide a bipolar cell with improved routing, density, and performance. Preferably, M is less than or equal to about 4, and N is greater than or equal to 2 and less than or equal to about 5 to provide a more optimal design flexibility.

Figure 3:
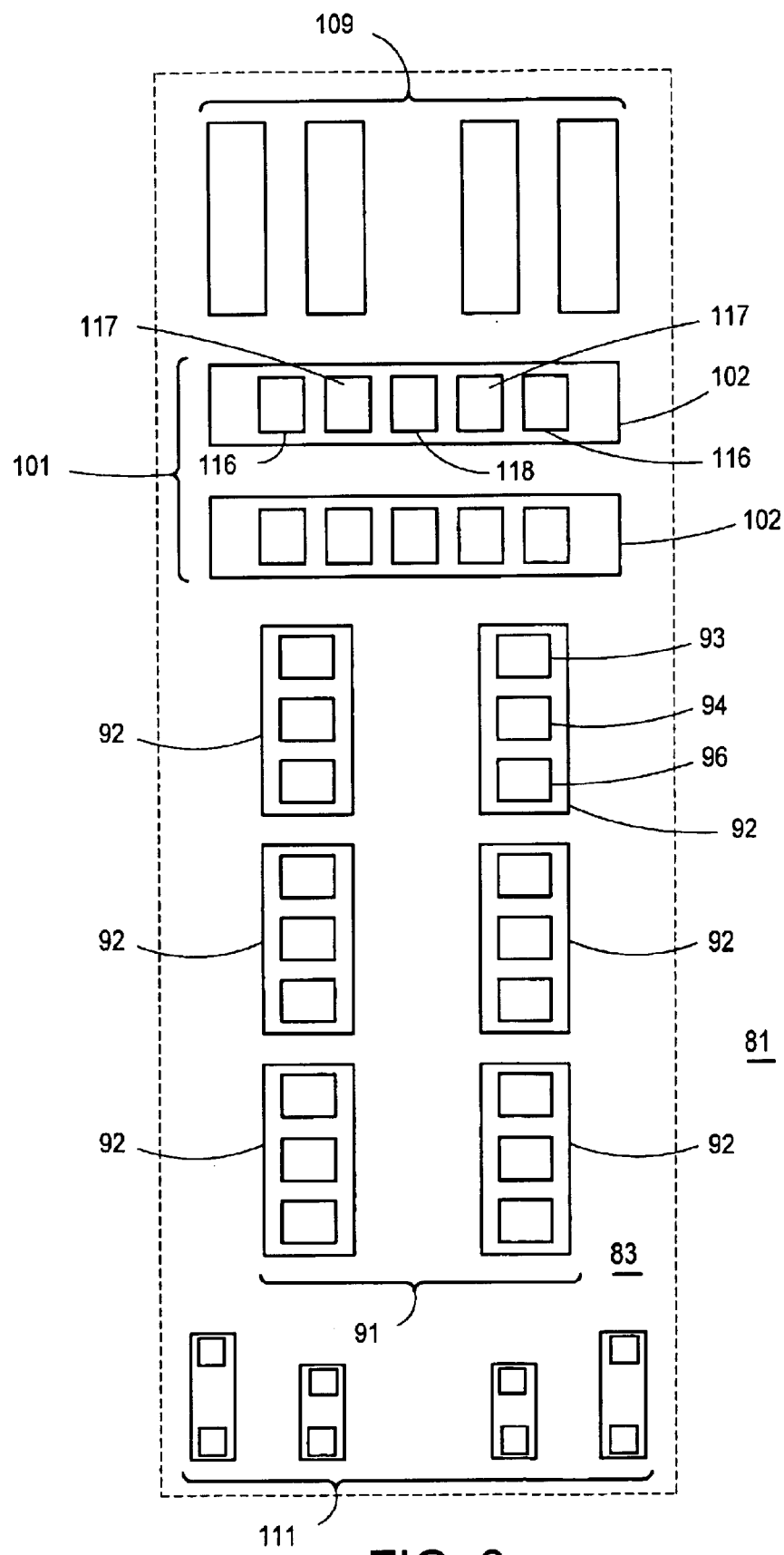
FIG. 3 illustrates an enlarged top plan view of another embodiment of a bipolar cell structure according to the present invention.

FIG. 3 shows an enlarged top view of an alternative embodiment of a bipolar cell, array, structure, or reconfigurable transistor array 81 according to the present invention. Bipolar cell 81 includes an active area, cell area, or device active area 83. Cell active area 83 includes a first array of bipolar transistors 91, where each bipolar transistor 92 in first array 91 is parallel to each other.

In cell 81, transistors 92 are designed, for example, to provide a current source and/or switching function. That is, within array 91, a portion of transistors 92 may provide one function, while another portion of transistors 92 may provide a different function. Preferably, for ease of use and flexibility, transistors 92 are the same size and their base, emitter, collector regions are ordered in a similar way. In a preferred embodiment, the transistors in array 92 comprise a collector 92, emitter 94, base 96 (i.e., collector/emitter/base) configuration.

Cell 81 further includes a second array of bipolar transistors 101 within cell active area 82, where each bipolar transistor 102 is parallel to each other, and oriented differently or in a different direction with respect to transistors 92. Preferably, transistors 101 are substantially orthogonal to, substantially perpendicular to, or rotated about 90 degrees with respect to transistors 92 in array 91. Additionally, transistors 101 are configured for an identical function. For example, transistors 102 are configured, for example, as switching devices.

Cell 81 further includes a first resistor array 109 adjacent array 101 and a second resistor array 111 adjacent to array 91. Preferably, the resistors in array 109 are parallel to each other, and the resistors in array 111 are parallel to each other as shown in FIG. 3. Preferably, the resistors in arrays 109 and 111 have a size and ratio that provides multiple choices for current and signal voltage swings.

According to the present invention, at least one of transistors 102 comprises a dual device or common collector configuration. That is, at least one of transistors 102 comprises a base 116, emitter 117, collector 118, emitter 117, base 116 (i.e., a base/emitter/collector/emitter/base) configuration, which provides a configuration better suited for applications such as latches and flip/flops. In one embodiment, each transistor 102 in array 101 comprise a common collector configuration.

Figure 4:
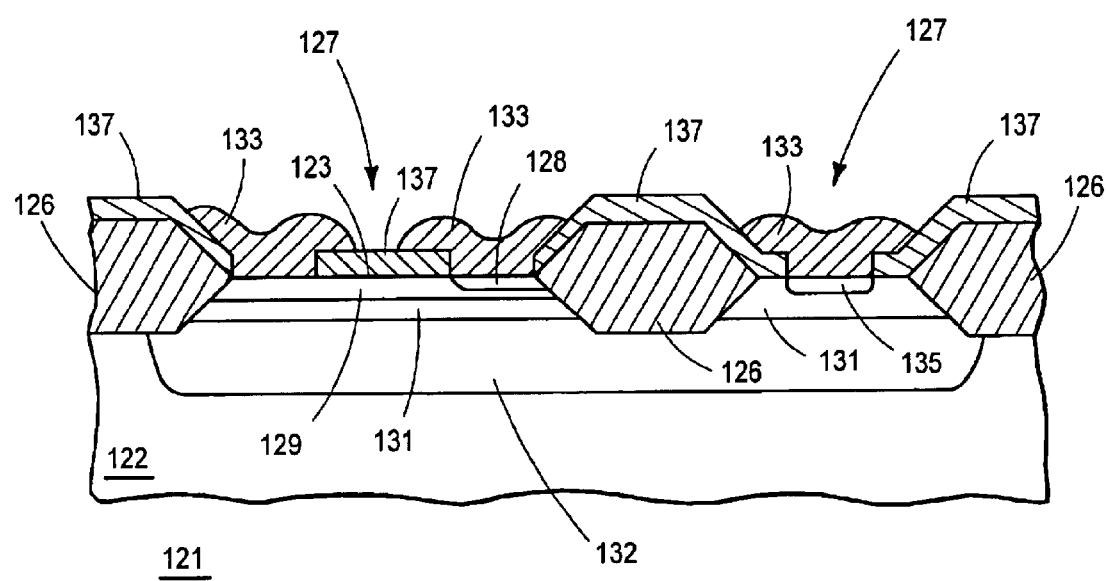
FIG. 4 illustrates an enlarged cross-sectional view of a bipolar transistor taken along reference line 2—2 of FIG. 2.

FIG. 4 shows an enlarged cross-sectional view of an example of a bipolar transistor or device 121 taken along reference line 2—2 of FIG. 2. The cell structure according to the present invention is not limited to a specific bipolar processing technology, and FIG. 4 is shown merely as a non-limiting example of a bipolar device that is compatible with the present invention.

Device 121 includes a semiconductor substrate 122 having a major or first surface 123, and passivation regions 126 that define device active areas 127. An emitter region 128 is formed in a base region 129, which is formed in an epitaxial layer 131. Layer 131 forms a collector region, and a buried layer 132 couples layer 131 to a separate collector contact region 133. Metal or ohmic contacts 136 provide contact to the specific device regions. Passivation layer 137 provides additional passivation and separation for the different regions of device 121.

According to the present invention, bipolar cells 31 and 81 are formed on a semiconductor substrate (e.g., semiconductor substrate 121). The term "on" as used herein means that the regions that make up bipolar cells 31 and 81 are formed in and/or below a surface of the semiconductor substrate (e.g., regions 129, 129, 131, 132, and 133), and other regions that make up bipolar cells 31 and 81 are on and/or above a surface of the semiconductor substrate (e.g., regions 133 and 137). Bipolar cells 31 and 81 provide a bipolar integrated circuit having improved performance and a higher density.

Figure 5:
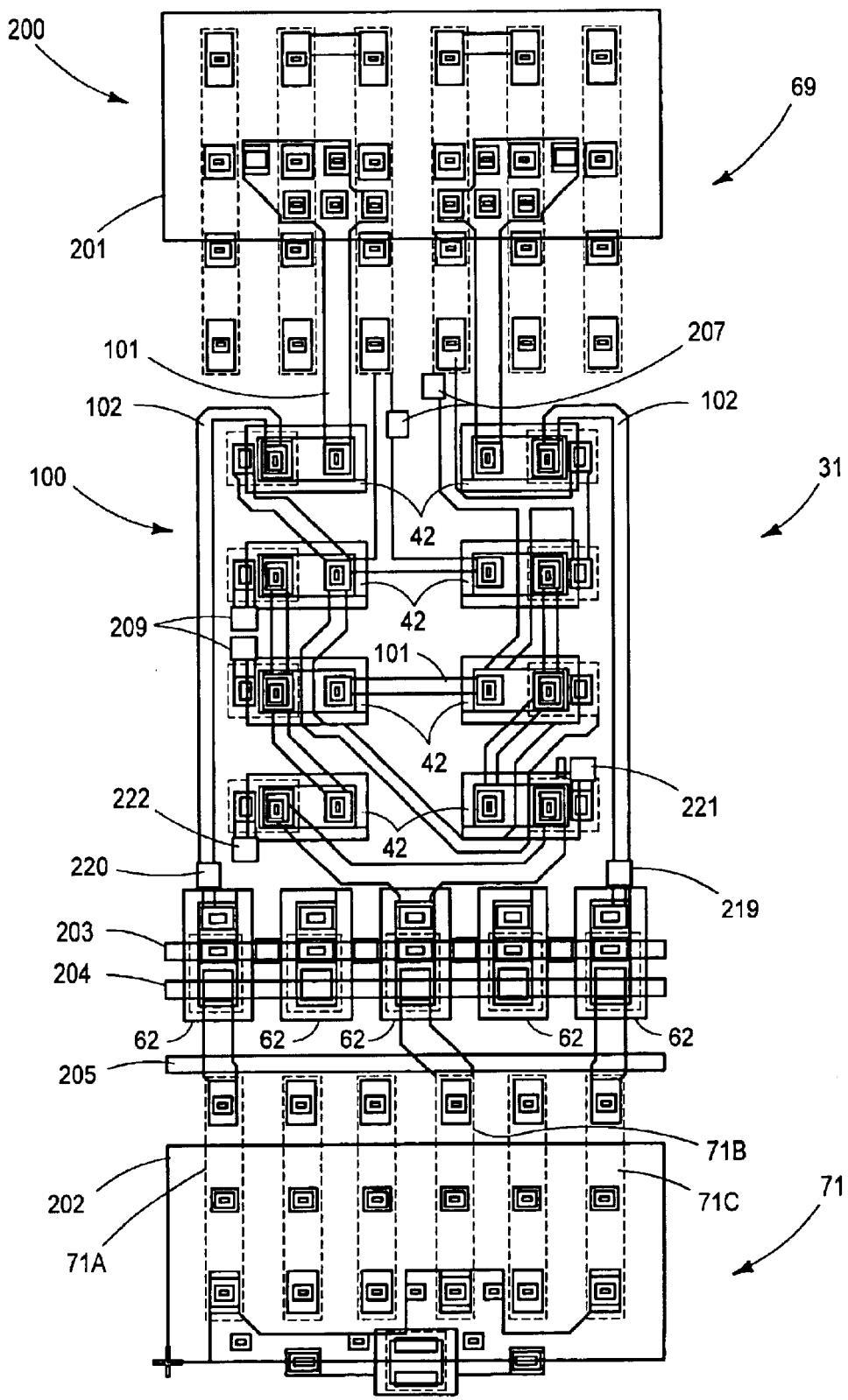
FIG. 5 illustrates an enlarged top view of the bipolar cell structure of FIG. 2 configured to provide an ECL latch.

FIG. 5 is a top view of bipolar cell 31 in an embodiment having first and second metal layers 100 and 200, respectively, in a first pattern. In particular, metal layers 100 and 200 are patterned so that bipolar cell 31 is configured to provide an emitter-coupled logic (ECL) latch function.

First metal layer 100 includes a plurality of traces 101 and 102 for locally routing bias voltages and logic signals within bipolar cell 31. Note that the different orientations of transistors 42 and 62 allows traces 102 of first metal layer 100 to be routed vertically within bipolar cell 31 as shown, thereby reducing the need to use traces on second metal layer 200 to provide local logic signal connections and enhancing the interconnect capability without increasing the cell size.

Second metal layer 200 includes a trace 201 for receiving a reference supply voltage $V_{CC}$ and a trace 202 for receiving a supply voltage $V_{EE}$. Traces 203, 204 and 205 of second metal layer 200 typically receive bias voltages for setting current and voltage levels for nodes within bipolar cell 31 and/or other bipolar cells formed on the same semiconductor die. For example, trace 203 receives a current source bias voltage $V_{CS}$ operating about 1.2 volts more positive than supply voltage $V_{EE}$ for setting current levels. Trace 205 remains unconnected in this configuration, but may be used to route supply or bias voltages or logic signals between bipolar cells lying on either side of bipolar cell 31.

Resistors 71A and 71C of resistor array 71 operate in conjunction with bias voltage $V_{CS}$ to set current levels of those transistors 62 and 42 that are being used. A differential data input signal is received on ports 209 of second metal layer 200, and a differential latched output signal is produced on an output ports 207. Ports 219 and 220 are emitter follower complementary outputs for buffering the signals on output ports 207. Ports 221–222 are differential latch enable input ports. Ports are implemented by routing signals on first metal layer 100 through vias for access on nodes or traces of second metal layer 200. This arrangement facilitates intercell interconnect routing to be accomplished mostly on second metal layer 200, which facilitates complex routing schemes without increasing the overall die size.

Figure 6:
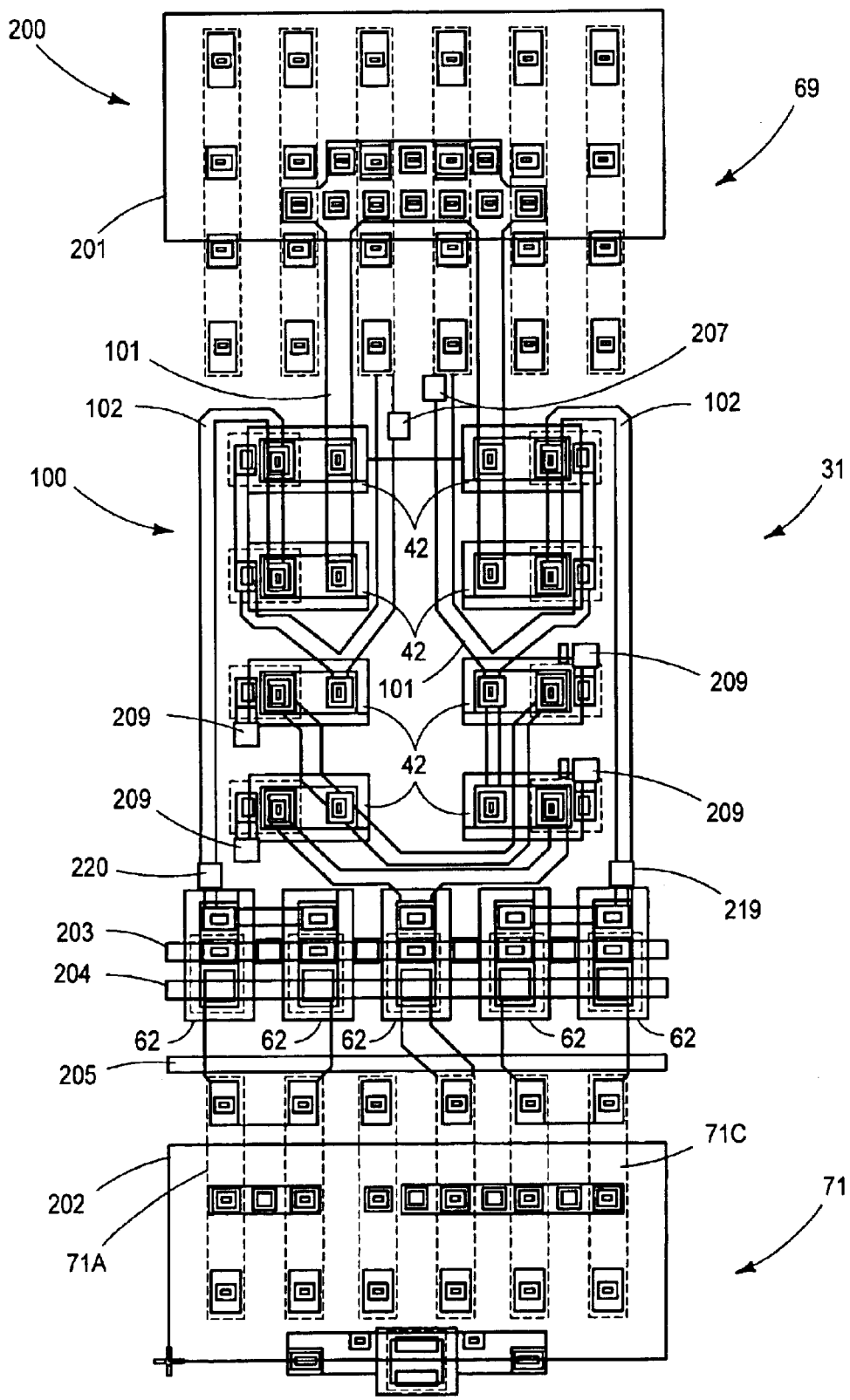
FIG. 6 illustrates an enlarged top view of the bipolar cell structure of FIG. 2 configured to provide an ECL AND/NAND gate function with emitter follower output drivers.

FIG. 6 is a top view of bipolar cell 31 in an embodiment in which first and second metal layers 100 and 200, respectively, are formed in a second pattern to configure bipolar cell 31 to provide an ECL AND/WAND gate function with emitter follower output drivers. Complementary differential data input signals are received on pairs of ports referred to as data input ports 209. A differential output signal is produced on ports 207. Emitter follower outputs are provided on ports 219–220.

The above embodiments show the versatility of the layout of bipolar cell 31, which provides a high degree of functionality in a small die area. A variety of additional functions can be produced by modifying the patterns of metal layers 100 and 200 from those shown in FIGS. 5 and 6. Simpler functions such as logic gates can be implemented with individual bipolar cells, while more complex functions such as shift registers and multiplexers are implemented by using two or more bipolar cells. For example, an AND gated type "D" flip flop can be implemented using three adjacent bipolar cells.

Thus it is apparent that there has been provided, in accordance with the present invention, a reconfigurable bipolar transistor cell that includes a first array of bipolar transistors that are parallel to each other, and a second array of bipolar transistors that are parallel to each other and oriented in a different direction than the transistors in the first array. The configuration according to the present invention provides a bipolar cell structure optimized for circuit density, ease of use, maximum performance, and sensitivity the process variation.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A bipolar cell comprising:
   a cell active area;
   a first array of bipolar transistors within the cell active area and configured for a first function, wherein the bipolar transistors within the first array are parallel to each other;
   a second array of bipolar transistors within the cell active area and configured for a second function different than the first function, wherein the bipolar transistors within the second array are parallel to each other and oriented in a different direction than the bipolar transistors in the first array.

2. The bipolar cell of claim 1 wherein the first array comprises a 2×M array, where M is less than or equal to 4.

3. The bipolar cell of claim 1 wherein the second array comprises a 1×N array, where N is greater than or equal to 2.

4. The bipolar cell of claim 1 wherein the bipolar transistors in the second array are substantially perpendicular to the bipolar transistors in the first array.

5. The bipolar cell of claim 1 further comprising an array of resistors.

6. The bipolar cell of claim 1 wherein the first array of bipolar transistors comprises switching transistors.

7. The bipolar cell of claim 1 wherein the second array of bipolar transistors comprises current source transistors.

8. The bipolar cell of claim 1 wherein each bipolar transistor in the first array of bipolar transistors comprises a collector/space/emitter/base configuration.

9. The bipolar cell of claim 1 wherein each bipolar transistor in the second array of bipolar transistors comprises a collector/base/emitter configuration.

10. A bipolar cell comprising
    a cell active area;
    a first array of bipolar transistors within the cell active area, wherein the bipolar transistors within the first array are parallel to each other;
    a second array of bipolar transistors within the cell active area, wherein the bipolar transistors within the second array are parallel to each other and substantially perpendicular to the first array of bipolar transistors, and wherein at least one bipolar transistor in the second array comprises a base/emitter/collector/emitter/base configuration.

11. The bipolar cell of claim 10, wherein the bipolar transistors in the first array comprise a collector/base/emitter configuration.

12. An integrated circuit comprising:
    a bipolar device array including a device active area, wherein the bipolar device array is formed on a semiconductor substrate;

a first array of at least two bipolar transistors formed within the device active area, wherein the bipolar transistors in the first array are parallel to each other;

a second array of at least two bipolar transistors formed within the device active area, wherein the bipolar transistors in the second array are parallel to each other and substantially orthogonal to the bipolar transistors in the first array.

13. The integrated circuit of claim 12 wherein the first array comprises an array of switching transistors.

14. The integrated circuit of claim 13 wherein the array of switching transistors comprises transistors having a collector/space/emitter/base configuration.

15. The integrated circuit of claim 13 wherein at least one device in the array of switching transistors comprises a common collector configuration.

16. The integrated circuit of claim 12 wherein the second array comprises an array of current source transistors.

17. The integrated circuit of claim 16 wherein the array of current source transistors comprises transistors having a collector/emitter/base configuration.

18. A method for forming an integrated circuit comprising the steps of:

providing a semiconductor substrate having a first major surface; and forming a bipolar device array on the first major surface, wherein the bipolar device array includes a device active area, a first array of at least two bipolar transistors within the device active area, and a second array of at least two bipolar transistors within the device active area, wherein the bipolar transistors in the first array are parallel to each other, and wherein the bipolar transistors in the second array are parallel to each other and substantially perpendicular to the bipolar transistors in the first array.

19. The method of claim 18 wherein the step of forming the bipolar device array includes forming a bipolar device array wherein the first array comprises an array of switching transistors, and wherein the second array comprises an array of current source transistors.

20. The method of claim 18 wherein the step of forming the bipolar device array includes forming a bipolar device array wherein at least one device in one of the first and second arrays comprises a base/emitter/collector/emitter/base configuration.

* * * * *